United States Patent [19]

Chu et al.

[11] Patent Number: 5,663,269
[45] Date of Patent: Sep. 2, 1997

[54] ORGANOSILOXANE FLUIDS PREPARED USING ORGANO-LITHIUM REAGENTS

[75] Inventors: Hsien-Kun Chu, Wethersfield; Robert P. Cross, Rocky Hill; Patrick J. Courtney, Newington; David I. Crossan, Hebron, all of Conn.

[73] Assignee: Loctite Corporation, Hartford, Conn.

[21] Appl. No.: 480,873

[22] Filed: Jun. 7, 1995

Related U.S. Application Data

[60] Continuation-in-part of Ser. No. 218,452, Mar. 25, 1994, abandoned, which is a division of Ser. No. 14,143, Feb. 19, 1993, Pat. No. 5,300,608, which is a continuation-in-part of Ser. No. 861,143, Mar. 31, 1992, abandoned.

[51] Int. Cl.$^6$ .................................................. C08G 77/08
[52] U.S. Cl. ..................... 528/14; 528/17; 528/18; 528/12; 528/32; 522/99; 522/40; 522/44; 522/46; 524/863; 524/866
[58] Field of Search .................................. 528/12, 14, 17, 528/18, 32; 522/99, 40, 44, 46; 524/863, 866

[56] References Cited

U.S. PATENT DOCUMENTS

| | | | |
|---|---|---|---|
| 3,878,263 | 4/1975 | Martin | 260/825 |
| 4,111,890 | 9/1978 | Getson et al. | 260/375 H |
| 4,138,543 | 2/1979 | Bargain et al. | 528/14 |
| 4,222,917 | 9/1980 | Razzano et al. | 260/29.1 SB |
| 4,528,081 | 7/1985 | Lien et al. | 528/12 |
| 4,683,251 | 7/1987 | Mikami | 522/46 |
| 4,683,320 | 7/1987 | Hida et al. | 556/453 |
| 4,699,802 | 10/1987 | Nakos et al. | 427/54.1 |
| 4,722,975 | 2/1988 | Itoh et al. | 525/288 |
| 4,772,675 | 9/1988 | Klosowski et al. | 528/15 |
| 4,956,221 | 9/1990 | Gutek | 428/142 |
| 5,055,502 | 10/1991 | Frances et al. | 524/780 |
| 5,079,324 | 1/1992 | Cocco et al. | 528/14 |
| 5,310,844 | 5/1994 | Weber et al. | 528/14 |

FOREIGN PATENT DOCUMENTS

| | | |
|---|---|---|
| 182941 B1 | 4/1986 | European Pat. Off. |
| 362710 A2 | 4/1990 | European Pat. Off. |
| 367696 | 5/1990 | European Pat. Off. |
| 354138 A1 | 7/1990 | European Pat. Off. |
| 470753 A2 | 12/1992 | European Pat. Off. |
| 559 045 A1 | 9/1993 | European Pat. Off. |
| 2243370 | 10/1991 | United Kingdom |

OTHER PUBLICATIONS

Eur. Polym. J. vol. 21, No. 2, pp. 135–140, 1985. *The Anionic Oligomerization of Hexamethylcyclotrisiloxane With Methylmethoxysilanes*.

Primary Examiner—Margaret W. Glass
Attorney, Agent, or Firm—Hoffmann & Baron

[57] ABSTRACT

The present invention relates to a process for preparing an alkoxy silyl-terminated material, which has at least two alkoxy groups on both terminal ends, said process comprising reacting in the presence of a catalytically effective amount of an organo-lithium reagent an alkoxysilyl-terminated first reactant with a second reactant having both ends of its chain terminating in a silanol. The alkoxy silyl-terminated material may have a variety of polymer backbone types such as silicone, polyurethane, polyamide and the like. These materials are intended to cure by either moisture or photo cure or by dual moisture and photo cure mechanisms. The alkoxy silyl-terminated material is preferably an organopoly-siloxane having at least two alkoxy groups at both terminal ends. The resultant alkoxy-terminated organopolysiloxanes are substantially stable materials as measured by preservation and maintenance of viscosity values (cps) over time and exhibit a higher crosslinking density when cured due to a higher degree of endcapping as compared to the prior art.

29 Claims, No Drawings

ORGANOSILOXANE FLUIDS PREPARED USING ORGANO-LITHIUM REAGENTS

BACKGROUND OF THE INVENTION

This is a continuation-in-part of application U.S. Ser. No. 08/218,452, filed Mar. 25, 1994, now abandoned, which is a divisional of application U.S. Ser. No. 08/014,143 filed Feb. 19, 1993, now U.S. Pat. No. 5,300,608 which is a continuation-in-part of U.S. Ser. No. 07/861,143 filed Mar. 31, 1992, now abandoned.

1. Field of the Invention

The present invention relates to the preparation of silyl-containing materials having alkoxy end groups. More specifically, this invention relates to the use of organo-lithium reagents in the preparation of organopolysiloxane materials having alkoxy terminal groups. These materials can also have olefin functionality, thereby allowing for dual cure by means of moisture and photo curable mechanisms.

2. Description of the Prior Art

It is known that alkoxy terminated polymers can be prepared by reacting di-, tri or .tetra-alkoxysilanes with diorganosiloxanes having silanol terminal groups at each end of the polymer chain. This reaction requires the use of specific catalysts such as amines, inorganic oxides, potassium acetate, organic titanium derivatives, titanium/amine combinations, carboxylic acid/mine combinations as well as carbamates and oxime-containing organic compounds. All of these catalyst systems have significant drawbacks, however. For example, amine catalyst systems are particularly slow and this lack of speed is often further exaggerated, depending upon the reactivity of the particular alkoxysilane. In addition, amines and carboxylic acid catalysts are corrosive and require special handling and removal processes once the reaction has proceeded to the desired state of completion. Catalyst reaction residue is particularly detrimental on the storage stability of the organosiloxane fluids and the properties of the resulting crosslinkable product. Removal of these catalysts is often difficult, requiring extra steps which are laborious and costly. Furthermore, many of these catalysts are particularly offensive to the body, giving off unpleasant odors and being dangerous to eyes and skin.

Organic titanium catalysts such as titanium tetra isopropionate have also been commonly used for these type of reactions but suffer from the deleterious effect of "thick-phasing", a result of titanium-silicon complexing. Before the intended reaction between the silanol-terminated organopolysiloxane and the alkoxy silane is complete, a thick gel-like phase forms, requiring additional shear forces and energy from the mixing blades to overcome this phase and allow the reaction to proceed. Thick-phasing is a particularly difficult problem when industrial-sized batches of the polymer are being prepared and the shear forces necessary to overcome thick-phasing are high. An example of the preparation of alkoxy-terminated organosiloxane fluids using titanium catalysts is found in U.S. Pat. No. 4,528,081 to Lien, et al. This patent prepares polyorganosiloxanes by reacting a silanol fluid with a silane having acrylic and alkoxy functionality using an organotitanate catalyst. This process of preparation suffers from thick phasing whereby the organotitanate reacts directly with the silanol fluid, rather than catalyzing the reaction between the silanol fluid and the siloxane. High shear mixing must be applied to break down unintended short-chain polymerization products which result in increased viscosity. Such high speed mixing is energy consuming and inefficient. As a result of those unwanted polymerization products, less efficient end-capping results. Less efficient end-capping means a smaller percentage of alkoxy terminal groups result and thus less available cross-linking sites are present. When polyorganosiloxanes prepared using titanate catalysts are cured, their hardness as measured by a durometer gauge is substantially lower than would occur if the aforementioned unwanted side products were not formed. Hardness of a vulcanized composition is directly dependent on the degree of crosslinking (see "Crosslinking of Rubbers" in *Comprehensive Polymer Science*, vol. 6, p. 116, 1989, Pergamon Press). Thus, the cured products produced by the Lien reference evidence lower hardness values than those prepared by the present invention as a result of the Lien polymer having a lower percentage of end-capping and consequently less available crosslinking sites.

Additionally, polyorganosiloxanes prepared using titanium catalysts, as well as many other prior art catalysts, are generally not shelf stable for long periods of time. One reason for this is that these catalysts generate monomethoxy terminated polydimethylsiloxanes as a by-product. These monoalkoxy terminated end-groups are not capable of participating in crosslinking and as a result, the crosslinking density of the final cured polymer is less when titanium catalysts and similar catalysts are used. The unwanted production of monoalkoxy terminated end-groups occurs both during the manufacture of the alkoxy-terminated organosiloxanes, as well as subsequently during storage. The generation of monomethoxy terminating groups during storage is a result of titanium catalyst remaining from production which causes a redistribution reaction to occur in situ and generates additional monomethoxy terminated end-capping. Over a period of time, this reaction continues, slowly eroding the ability of the polymer to cure due to the loss of available crosslinking sites.

The present invention seeks to avoid the aforementioned disadvantages by using an organo-lithium catalyst, which does not react directly with the silanol fluid during reaction to cause thick-phasing and which does not result in in situ generation of monoalkoxy termination which is incapable of participating in crosslinking. The resulting organosiloxane formed has a higher degree of alkoxy end-capping and an ability to produce a higher degree of crosslinking than organosiloxanes formed from other catalysts. This results in a harder polymer when cured. The organo-lithium catalysts used to prepare the inventive fluids are not effective as curing agents, as are the titanium catalysts of the prior art. Thus, the organo-lithium catalysts are not intended to be present in the curable one-part compositions which can be formulated from the inventive fluids. To achieve this, the organo-lithium catalysts of the present invention are quenched with carbon dioxide to form a nonreactive salt.

It should be mentioned that the aforementioned patent to Lien, et al. uses organotitanate to both make the polymer and to cure it. Thus, the presence of organotitanate catalyst in the polymer thus formed has not been viewed as problematic since it is also used as a curing agent in compositions containing the polymer. As previously mentioned, however, the presence of this catalyst during shelf storage is deleterious to the stability and final cured properties of the organopolysiloxanes. Thus, organopolysiloxanes prepared from organotitanate catalysts cannot be stored for long periods of time without suffering from the above disadvantages.

The present invention further improves the stability and shelf life of the polymer and compositions prepared therefrom by quenching the organo-lithium catalyst during preparation of the organopolysiloxane with carbon dioxide to form lithium carbonate which is inactive.

As a result of the use of an organo-lithium catalyst, a higher efficiency and greater percentage of end-capping results. This effect directly results in a higher crosslinking density when cured due to the greater percentage of available sites as compared to the prior art, and particularly when compared to organopolysiloxanes prepared using organotitanate catalysts.

More recently, U.S. Pat. No. 5,079,324 to Cocco et al. discloses the use of lithium hydroxide as a catalyst for the reaction of diorganosiloxanes having terminal silanol groups, with a polyalkoxysilane of the formula:

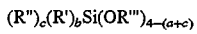

wherein R' and R" may be, for example, a monovalent hydrocarbon radical that may contain functional groups $C_{1-13}$; and R'" is an aliphatic radical $C_{1-8}$.

However, lithium hydroxide is an inorganic solid which requires use of a polar solvent such as methanol to introduce it as a solution into the reaction. Due to the presence of methanol, this catalyst system has the distinct disadvantage of being continually regenerated in the form of lithium methoxide. The resultant polymer product exhibits a rapid lowering of viscosity due to attack of the regenerated lithium catalyst upon the siloxane. The viscosity drop, although generally rather immediate, becomes more pronounced over time and shelf life is therefore greatly affected. Furthermore, subsequent curing of this functionalized polymer is also deleteriously affected. It is believed that the viscosity drop is directly related to cleavage of the siloxane bond by the regenerated lithium, resulting in a significantly lower molecular weight and product instability. Cleavage of the siloxane bond can result in monoalkoxy endcapping, which is undesirable because of its inability to crosslink. Siloxane bond cleavage also occurs in situ subsequent to the reaction due to residual titanium catalysts that are used in the prior art. The present invention avoids these problems.

The use of butyl lithium in combination with hexamethylphosphoroamide as initiators for the oligomerization of hexamethylcyclotrisiloxane with methylmethoxysilanes is disclosed in Eur. Plym J., Vol. 21, No. 2, pp. 135–140, 1985 entitled "The Anionic Oligomerization of Hexamethylcyclotrisiloxane with Methylmethoxysilanes". This reference discloses the use of butyl lithium as well as inorganic bases as a means to ring-open hexamethylcyclotrisiloxane in the presence of methylmethoxysilane.

EPA 362710 to Toray Silicone Company discloses a method of synthesizing a diorganopolysiloxane in which a polymerizable functional group is present at one or both molecule chain ends. The synthesis involves the opening of a cyclotrisiloxane using an alkali metal silanolate, which bears the polymerizable functional group, as a polymerization initiator in the presence of an organosilane or organopolysiloxane. This reference states that if the reaction is run at equilibrium, a mixture of products is produced, i.e. polymer with functional groups at both ends and polymer without functional groups at either end. This reference does not teach a method of end-tapping with alkoxy groups on both ends of the polymer but rather a polymerization reaction using cyclic trisiloxane as the living polymerization monomer.

U.S. Pat. No. 3,878,263 to Martin discloses a polymerization reaction which uses organo-lithium catalysts in aprotic solvent as well as inorganic lithium catalysts to polymerize a cyclic organopolysiloxane with an acrylate functional silane or siloxane. This reference begins with different starting materials from the present invention to perform a ring-opening reaction, i.e. siloxane cleavage. The resultant polymers have only one end terminating in an alkoxy group, the other end terminated with the acrylate group. The polymerization reaction is controlled by the terminating methacryloxy group. Those catalysts disclosed include lithium alkoxide compounds such as lithium methoxide; lithium alkyls such as ethyl lithium, isopropyl lithium, n-butyl lithium, vinyl lithium; lithium aryls such as phenyl lithium; lithium hydride, lithium aluminum hydride, lithium silanolate and lithium hydroxide.

There is a definite need for a process for making viscosity stable alkoxy silyl-containing materials, such as alkoxy terminated organopolysiloxanes, which is non-corrosive, fast and does not suffer from the unpleasant odors and other disadvantages of the prior art catalyst systems. Additionally, there is a need for such compositions which exhibit stable shelf life and can be useful for making such products as sealants, adhesives, coatings and the like.

SUMMARY OF THE INVENTION

In one embodiment, the present invention relates to a process for preparing an alkoxy silyl-terminated material, which has at least two alkoxy groups at each terminal end, said process comprising reacting in the presence of a catalytically effective amount of an organo-lithium reagent an alkoxysilane first reactant with a second reactant having at least one end of its chain terminating in a silanol group. The alkoxy silyl-terminated material may have a variety of polymer backbone types such as silicone, polyurethane, polyamide and the like. These materials are intended to cure by either moisture cure or photo cure or by dual moisture and photo cure mechanisms.

The alkoxy silyl-terminated material is preferably an organopolysiloxane having at least two terminal alkoxy groups on each end. Such a material is a product of the reaction of an organopolysiloxane, having both ends terminated with a silanol group, with a silane containing at least three alkoxy groups, said reaction occurring in the presence of a catalytically effective amount of an organo-lithium reagent. The resultant alkoxy-terminated organopolysiloxanes are substantially stable materials as measured by their ability to maintain substantially constant viscosity values (cps) over time. Additionally, removal of residual organo-lithium catalyst is easily accomplished through filtration. This catalyst system also does not generate offensive odors as do other catalysts.

In a more preferred embodiment, the alkoxy terminated organopolysiloxanes of the present invention have vinyl and preferably acrylate functionality as well, allowing for dual photo and moisture curing. One such example is the reaction product of methacryloxypropyltrimethoxysilane with a silanol terminated polydimethylsiloxane fluid in the presence of a catalytic amount of an organo-lithium catalyst.

The present invention further relates to compositions capable of curing by both moisture and photo curing mechanisms and having a substantially shelf stable viscosity, said compositions comprising:

(a) a reactive organopolysiloxane having at least two alkoxy groups on both terminals end and at least one photocurable group on at least one terminal end;

(b) an effective amount of a photoinitiator; and (c) an effective amount of a moisture curing catalyst;

wherein said reactive organopolysiloxane of (a) is the reaction product of an organopolysiloxane having at least both ends terminating with a silanol group with a silane containing at least three alkoxy groups and at least one photo-curable group, said reaction occurring in the presence of a catalytically effective amount of an organo-lithium reagent.

The novel use of catalytic amounts of organo-lithium reagents in the inventive process provides a new method of end-capping an organopolysiloxane fluid with alkoxy groups without the disadvantage heretofore enumerated. Of particular significance is that the resultant alkoxy end-capped organopolysiloxanes maintain a viscosity substantially equivalent (i.e. substantially no viscosity drop) to the viscosity of the silanol terminated siloxane starting material, which indicates both completeness of reaction, e.g. substantially no silanol groups remaining unreacted, as well as stability of the final polymer. As previously stated, due to the higher efficiency and completeness of end-capping of the present invention over the prior art, the degree of crosslinking is greater when the polymer is cured. This higher crosslinking density yields a higher hardness level as compared to the prior art.

The organo-lithium reagents useful in the present invention are represented by the formula $LiR^{12}$ wherein the organo group $R^{12}$ is selected from the group consisting of $C_1$ to $C_{18}$ alkyl, aryl, alkylaryl, arylalkyl, alkenyl, alkynyl groups, amine-containing compounds, as well as organosilicon-containing compounds. $R^{12}$ can have from 1 to 18 carbon atoms in the chain ($C_{1-18}$). These reagents are present in catalytically effective amounts and are critical both to the process and the quality of product made therefrom.

DETAILED DESCRIPTION OF THE PREFERRED EMBODIMENTS

More particularly those alkoxy-terminated organosiloxanes of the present invention are represented by the formula:

I.

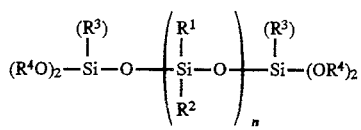

wherein $R^1$, $R^2$, $R^3$ and $R^4$ may be identical or different and are monovalent hydrocarbon radicals having up to 10 carbon atoms($C_{1-10}$) or halo or cyano substituted hydrocarbon radicals; $R^3$ may also be $OR^4$ or a monovalent heterohydrocarbon radical having up to 10 carbon atoms ($C_1$-$C_{10}$) wherein the hetero atoms are selected from O, N and S; R4 is alkyl($C_{1-10}$), preferably methyl, ethyl or isopropyl; $R^4$ may also be $CH_2CH_2OCH_3$; and n is an integer.

A most preferred embodiment has the following formula where $R^3$ is a methacryloxy-propyl group, $CH_2C(CH_3)$-$COOC_3H_6$, $R^4$ is methyl or ethyl, and $R^1$ and $R^2$ are as described in Formula I above, but are preferably methyl, to give the following formula:

II.

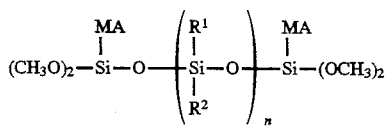

wherein MA is the methacryloxypropyl group, and n is from 1 to 1,200.

Due to the presence of both alkoxy and (meth)acrylate groups, this preferred embodiment has the capability of curing by both moisture and photo curing mechanisms.

Thus, for example, this polymer fluid material or a composition comprising the material can be subjected to UV light in the presence of a photoinitiator to partially cure or gel the material, which can then be allowed to cure further by moisture in ambient conditions.

The silanol-terminated reactant can be virtually any useful silanol-terminated material having the general formula:

III.

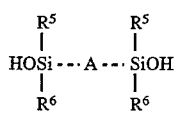

wherein A represents a polymer or copolymer backbone, which can be any number of combinations of polyurethane, silicone, polyamide, polyether and the like; and $R^5$ and $R^6$ may be identical or different and are monovalent hydrocarbon radicals having up to 10 carbon atoms ($C_{1-10}$) or halo or cyano substituted hydrocarbon radicals.

Preferably, however, this reactant is a silanol-terminated organopolysiloxane having the formula:

IV.

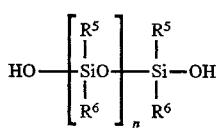

wherein $R^5$ and $R^6$ are defined as in formula III above. Preferred groups for $R^5$ and $R^6$ are alkyl $C_{1-10}$ and most preferably methyl, ethyl and isopropyl, although aryl groups such as phenyl are contemplated, as well as vinyl groups. The number of repeating units will determine the molecular weight and hence the viscosity of this starting material. Thus, n can be, for example, an integer which, for example, can be from about 1 to about 1,200, preferably from about 10 to about 1,000. The viscosity of these materials is not critical and can easily be chosen to fit a particular product application, particularly because the alkoxy terminated end product of this reaction will have substantially the same viscosity as the silanol-terminated reactant. Viscosities of these silanol-terminated organopolysiloxanes can range from about 1 cps to about 150,000 cps (Brookfield, 25° C). The preferred range for those used in the present invention are about 100 to about 60,000 cps.

An example of one such silanol-terminated organopolysiloxane is polydimethylsiloxane having the formula:

V.

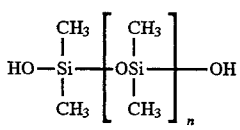

The second reactant is a silane containing at least three alkoxy groups and having the formula:

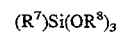

(R$^7$)Si(OR$^8$)$_3$                                            VI.

wherein $R^7$ and $R^8$ can be identical or different monovalent hydrocarbon radicals having $C_{1-10}$; $R^7$ may also be a monovalent heterohydrocarbon radical having 1 to 10 carbon atoms wherein the hetero atoms are selected from the group consisting of halo atoms, O, N and S.

Preferably, $R^7$ and $R^8$ are selected from the group consisting of methyl, ethyl, isopropyl, vinyl, phenyl, methacryloxypropyl and norbornenyltrimethoxy; and $R^8$ is preferably selected from the group consisting of methyl, ethyl, isopropyl and $CH_2CH_2OCH_3$. Of particular usefulness in the present invention are vinyltrimethoxy-silane and methyltrimethoxysilane.

Other representative polyalkoxysilanes useful in the present invention include:

$Si(OCH_3)_4$, $Si(OCH_2CH_3)_4$, $Si(OCH_2CH_2CH_3)_4$, $(CH_3O)_3SiCH_3$, $(C_2H_5O)_3SiCH_3$, $(CH_3O)_3SiCH=CH_2$, $(C_2H_5O)_3SiCH=CH_2$, $(CH_3O)_3SiCH_2-CH=CH_2$, $(CH_3O)_3SiCH_2-(CH_3)C=CH_2$, $(C_2H_5O)_3Si(OCH_3)$, $Si(OCH_2-CH_2-OCH_3)_4$, $CH_3Si(OCH_2-CH_2-OCH_3)_3$, $CH_2=CHSi(OCH_2CH_2OCH_3)_3$, $C_6H_5Si(OCH_3)_3$, $C_6H_5Si(OCH_2-CH_2-OCH_3)_3$, $(CH_3O)_3Si(CH_2)_3O-CH_2-\underset{\underset{O}{\diagdown\diagup}}{CH}-CH_2$, $(CH_3O)_3Si(CH_2)_3-Cl$, $(CH_3O)_3Si(CH_2)_3OOC(CH_3)C=CH_2$, $(C_2H_5O)_3Si(CH_2)_3N\underset{N}{\diagdown\diagup}$, $(C_2H_5O)_3Si(CH_2)_2CH_2-Cl$, $(CH_3O)_3Si(CH_2)_3NH_2$, $(C_2H_5O)_3Si(CH_2)_3NH_2$, $(CH_3O)_3Si(CH_2)_3NH(CH_2)_2NH_2$, $(C_2H_5O)_3Si(CH_2)_3NH(CH_2)_2NH_2$, $(CH_3O)_3-Si(CH_2)_3SH$, and $(CH_3O)_3Si(CH_2)_3OOCH=CH_2$.

The organo-lithium reagents useful in the present invention are represented by the formula $LiR^{12}$ wherein the organo group $R^{12}$ is selected from the group consisting of $C_{1-18}$ alkyl, $C_{1-18}$ aryl, $C_{1-18}$ alkylaryl, $C_{1-18}$ arylalkyl, $C_{1-18}$ alkenyl, $C_{1-18}$ alkynyl, amine-containing compounds, as well as organosilicon-containing compounds. $R^{12}$ can have from 1 to 18 carbon atoms in the chain ($C_{1-18}$). These reagents are present in catalytically effective amounts and are critical both to the process and the quality of product made therefrom.

The organo-lithium catalyst is preferably an alkyl lithium such as methyl, n-butyl, sec-butyl, t-butyl, n-hexyl, 2-ethylhexyl butyl and n-octyl butyl lithium. Other useful catalysts include phenyl lithium, vinyl lithium, lithium phenylacetylide, lithium (trimethylsilyl) acetylide, lithium silanolates and lithium siloxanolates. The organo group can also be an amine-containing compound, such as dimethylamide, diethylamide, diisopropylamide or dicyclohexylamide, or a silicon-containing compound.

Useful lithium silanolates have the formula $LiOSiR^9R^{10}R^{11}$ wherein $R^9$ and $R^{10}$ are monovalent hydrocarbon radicals $C_{1-10}$, preferably alkyl such as methyl, ethyl and butyl, as well as aryl such as phenyl; and $R^{11}$ is an alkyl or aryl group with $C_{1-18}$.

Useful lithium siloxanolates have the formula $Li(OSiR^9R^{10}O)_tSiR^9R^{10}R^{11}$ wherein $R^9$ and $R^{10}$ are as described above; $R^{11}$ is as described above and t is an integer, preferably from 1 to 10.

The organo-lithium reagents are used in catalytically effective amounts. Generally, this amount will vary with the specific catalyst and reactant materials but about 1 to 1000 ppm based on the atomic weight of lithium are useful. A more preferred range is 15–250 ppm.

Neither polar nor aprotic solvents should be introduced to the catalyst solution or the reaction mixture in order to prevent undesired and uncontrolled catalyst regeneration and subsequent siloxane bond cleavage. However, insignificant amounts of alcohol are produced in situ during the reaction. The presence of this minor byproduct is so small that no perceptible drop or effect on the viscosity stability of the final product is observed. These minor amounts of alcohol byproduct can be optionally removed during or immediately subsequent to the reaction. As previously mentioned, no titanium catalyst is to be used in the formulation of the polymer, and therefore no residual titanium will be left in the thus formed fluid. The organo-lithium catalyst, which is only effective in endcapping the organopolysiloxane but not effective in curing the end-capped product, is quenched to form a salt such as lithium carbonate, which is not reactive in the system and is easily removed. The resultant alkoxy end-capped fluid is substantially free of catalyst residue and monoalkoxy functional end groups.

The reaction process of the present invention comprises the addition of the silanol terminated organosiloxane, alkoxysilane and organo-lithium solution into a reactor vessel. The mixture is then heated with stirring and in the absence of moisture, for example under nitrogen conditions, for about ½ to about 5 hours at temperatures of from ambient to about 110° C., preferably from 25° C. to about 60° C., or until alkoxy end-capping has been completed. One indication that end-capping is complete is the absence of thick phasing when titanium catalyst is added. The mixture is then quenched with bubbled or liquid carbon dioxide or dry ice and further cooled. The formation of lithium carbonate can be easily removed, if desired, through filtration. Neutralization of the catalyst is optionally carried out, preferably with carbon dioxide in the form of dry ice. Acids may also be used for neutralization, as well as compounds such as silyl phosphate, silyl acetate and the like. Condensation moisture aids in the neutralization process. Volatile materials, if any, are vacuum stripped. Equimolar amounts of the silanol-terminated organopolysiloxane (based on the moles of SiOH functionality) and the alkoxysilane can be used in the reaction, but excess alkoxysilane is preferred. In the preparation of a one-part dual curing composition, it is preferred to add only a slight excess of alkoxysilane to control the potential viscosity increase. Thus, for example, in such cases 1.0 to 1.5 moles of alkoxysilane is preferred for every mole of silanol.

The resultant alkoxy end-capped organosiloxane fluids can then be mixed with other conventional additives such as curing agents, fillers, initiators, promoters, pigments, moisture scavengers and the like to form a one-part curable composition. Fillers such as hydrophobic fumed silica or quartz serve to impart desirable physical properties to the cured material. Moisture scavengers such as methyltrimethoxysilane and vinyltrimethyloxysilane are useful.

These curable compositions are obtained by adding to 100 parts (by weight) of the functionalized polymer prepared according to the process of the present invention:

(a) 0 to 250 parts of inorganic fillers;

(b) 0 to 20 parts, preferably 0 to 10 parts of adhesion promoters such as silanes or polysiloxanes simultaneously bearing per molecule:

(i) at least one $C_3$-$C_{15}$ organic group bonded by a SiC bond to the silicon atom and substituted by amino, glycldoxy or mercapto radicals and the like; and (ii) at least one $C_1$-$C_3$ alkoxy radical or a $C_3$-$C_6$ alkoxyalkyleneoxy radical; and (c) an effective amount of a condensation catalyst.

By "effective amount" of condensation catalyst is intended, for example, from about 0.1 to about 5% by weight and preferably about 0.25 to about 2.5% by weight of at least one compound of a metal which is typically selected from among titanium, tin, zirconium and mixtures thereof. Tetraisopropoxytitanate and tetrabutoxytitanate are preferred. U.S. Pat. No. 4,111,890 lists numerous others that are useful.

Additionally, due to the absence of residue catalysts from the manufacturing process as well as due to the dialkoxy terminal functionality present and efficiency of this endcapping, the formation of undesirable in situ monoalkoxy terminated polymer is prevented. This allows for substantially indefinite storage stability prior to the addition of a moisture curing catalyst which is used to formulate a one-part system. These one-part curable systems demonstrate substantially no viscosity drop over time, thus enhancing storage stability of the final product. For example, this invention contemplates a composition capable of curing by both moisture and photo cure mechanisms and having a substantially shelf stable viscosity, said composition comprising:

(a) a reactive organopolysiloxane having at least two alkoxy groups attached to the silicon atom on both terminal ends and at least one photo curing group on at least one terminal end;

(b) an effective amount of a photoinitiator; and (c) an effective amount of a moisture curing catalyst;

wherein said reactive organopolysiloxane is the reaction product of an organopolysiloxane having both ends terminating with a silanol group with a silane containing at least three alkoxy groups and at least one photo-curable group, said reaction occurring in the presence of a catalytically effective amount of an organo-lithium reagent.

It should be appreciated that the reactive organopolysiloxane materials prepared in accordance with the present invention may be curable by moisture alone. In such cases no photoinitiator need be present.

In formulating useful dual curing compositions of the invention it is necessary to include in the formulation a moisture curing catalyst, such as a titanium catalyst, in the formulation.

The dual curing compositions utilized in the invention also include a photoinitiator. Any known radical photoinitiator can be used as well as mixtures thereof without departing from the invention hereof. Sample photoinitiators include benzoin and substituted benzoin compounds, benzophenone, Michler's ketone dialkoxybenzophenones, dialkoxyacetophenones, and the like. Photoinitiators made compatible with silicones by binding photoinitiating groups to organosiloxane polymer backbones may also be used.

The amount of photoinitiator used in the composition will typically be in the range of between about 0.1% and 5% of the composition. Depending on the characteristics of the particular photoinitiator, however, amounts outside of this range may be employed without departing from the invention so long as they perform the function of rapidly and efficiently initiating polymerization of the acrylic groups. In particular, higher percentages may be required if silicone bound photoinitiators are used with high equivalent weight per photoinitiating group.

It should also be understood that while the photoinitiator is used as a separate ingredient, the formulations used in the inventive method are intended to include formulations in which photoinitiating groups are included on the backbone of the same organopolysiloxane polymer which includes the photo curing and alkoxy groups discussed above. Preferred photo curing groups which may be attached to the organopolysiloxane include acrylate, methacrylate and glycidoxy groups.

The inventive compositions may also contain other additives so long as they do not interfere with U.V. and moisture curing mechanisms. These include adhesion promoters such as glycidoxypropyltrimethoxysilane, aminopropyltrimethoxysilane, methacryloxypropyltrimethoxy-silane, triallyl-S-tria-zine-2, 3,6(1H.3H.5H)-trione aminoethylaminopropyltrimethoxysilane and others known to those skilled in the art; fillers such as silica, microballoon glass and the like are useful for their conventional purposes.

The invention may be further understood with reference to the following non-limiting examples. Percent weights are per the total composition unless otherwise specified. Viscosities are measured using a Brookfield viscometer with either a spindle #6 or #4 at 10 rpm, 25° C., unless otherwise specified.

EXAMPLE 1

A lithium n-butyldimethylsilanolate catalyst solution was prepared by first dissolving 25 g of hexamethylcyclotrisiloxane in 25 g of hexane followed by adding 172 ml of a 1.6M n-butyl lithium (0.275 mole) in hexane (120 g) into this hexamethylcyclotrisiloxane solution. Exothermic reaction was noted upon mixing. The resulting solution after cooling to room temperature was used as the end-capping catalyst.

A 50,000 cps (spindle #6) silanol terminated polydimethylsiloxane fluid with a GPC analysis showing weight average molecular weight of 99,000 and number average molecular weight of 72,500 (relative to polystyrene standard) was used for end-tapping by vinyltrimethoxysilane. Five kilograms of this fluid, 48 g of vinyltrimethoxysilane and 6.5 g of the above lithium n-butyldimethylsilanolate solution was mixed in a reactor. The mixture was heated to 55° C. for 3 hours. A few small pieces of dry ice totalling 5 g was then placed into the mixture. After cooling, the mixture was vacuum stripped for 15 minutes at room temperature to remove any volatile materials. The viscosity of the mixture was found to be 45,000 cps (spindle #6) and the mixture was found to be stable during storage. GPC analysis of this mixture showed weight average molecular weight of 101,000 and number average molecular weight of 74,000.

Sixty-five parts of this mixture was then mixed with 27.5 parts of a hydrophobic fumed silica, 7 parts of vinyltrimethoxysilane (moisture scavenger) and 0.5 parts of titanium isopropoxide in the absence of air and moisture to form a sealant or coating composition. No thick phasing was observed during mixing indicating complete end-tapping. In contrast, when silanol fluid alone was used with vinyltrimethoxysilane instead of the end-capped fluid, immediate thickening upon the addition of titanium isopropoxide to the mixture was noted.

The sealant thus prepared was allowed to cure in ambient conditions for 7 days. The following properties were observed for the cured rubber: Tensile 956 psi; Elongation 700%; Hardness (Shore A) 36; and Tensile at 100% elongation 90 psi. The surface of the cured material was non-tacky and dry to the touch.

EXAMPLE 2

The above example was repeated using a 16,000 spindle #6) cps silanol terminated polydimethylsiloxane fluid. Five kilograms of the silanol fluid, 67 g of vinyltrimethoxysilane, and 6.5 g of the above-described catalyst solution were used. The silanol terminated polydimethylsiloxane fluid was found to have a weight average molecular weight of 79,000 and a number average molecular weight of 57,000. After end-capping, the material showed a viscosity of 14,000 cps (spindle #6), weight average molecular weight of 74,000, and number average molecular weight of 53,000.

Sixty-five parts of the end-capped fluid was compounded with 27.5 parts of the hydrophobic fumed silica, 7 parts of the moisture scavenger vinyltrimethoxysilane and 0.5 parts of the moisture curing catalyst titanium isopropoxide. No thick phasing of the mixture was noted. The compounded sealant after 7 day cure at ambient conditions gave the following properties: Tensile 800 psi; Elongation 530%; Hardness (Shore A) 40; and Tensile at 100% elongation 116 psi. The cured material was surface dry.

EXAMPLE 3

This example demonstrates the preparation of a dual cure system. Five hundred grams of a 2,000 cps (spindle #4) silanol terminated polydimethylsiloxane fluid was placed in a 1000 ml three neck round bottom flask. Fourteen grams of methacryloxypropyltrimethoxysilane then was added. To the stirred mixture was further added 0.65 g of the lithium n-butyldimethylsilanolate solution previously prepared (i.e., 15 ppm Li). The mixture was stirred at room temperature under nitrogen for 3 hours. The temperature of the mixture rose to 50° C. due to shearing. A gentle stream of carbon dioxide was bubbled into the system for 10 minutes for catalyst quenching. The mixture was then heated to 110° C. under nitrogen sparge for 30 minutes to remove volatile materials. The mixture was then allowed to cool down to room temperature. The mixture showed a viscosity reading of 3,100 cps (spindle #4) (Brookfield Viscometer, spindle #4 at 10 rpm). The mixture showed substantially no viscosity change during 4 months of storage.

A formulation for coating or sealing was prepared by mixing 49.10 g of this end-capped material with 0.75 g of diethoxyacetophonone and 0.15 g titanium isopropoxide. The mixture was subjected to UV cure using a Fusion System UV chamber with an H bulb. The material was placed in between 2 layers of polyethylene films with 1 mm thickness which are 0.075" apart. The films were held in a glass plate fixture. The material was cured by UV with an intensity of 75 mw/cm$^2$ for one minute on each side. The cured material showed a hardness of 41 (Shore OO). The material was further moisture cured in 3 days to give a hardness of 61 (Shore OO). In contrast, simply mixing silanol terminated polydimethysiloxane fluid with 3-methacryloxypropyltrimethoxysilane and diethoxyacetophenone did not produce a UV curable material.

EXAMPLE 4

The end-capped material described in Example 3 was further formulated into a sealant composition by mixing 90 g of the fluid with 10 g of a hydrophobic fumed silica, 0.75 g of diethoxyacetophenone and 0.3 g titanium isopropoxide. The mixture was subjected to UV cure as described in Example 3. The material after initial UV cure gave a hardness of 66 (Durometer Shore OO). After the initial UV cure, the material was further moisture cured in ambient conditions for 3 days. The material then gave the following properties: Hardness 88 (Shore OO); Tensile 180 psi; Elongation 120%; and Tensile at 100% elongation 150 psi.

In contrast, simply mixing silanol terminated polydimethylsiloxane with 3-methacryloxypropyltrimethoxysilane, fumed silica, diethoxyacetophenone and titanium isopropoxide caused immediate thickening (thick-phasing) and did not yield a material useful as a sealant.

EXAMPLE 5

A catalyst solution of lithium t-butyl dimethyl silanolate catalyst was prepared by first mixing 3.8 g of hexamethylcyclotrisiloxane in 3.8 g of hexane followed by adding 15 g of a 1.7M t-butyl lithium (0.04 mole) in pentane to this solution. No exothermic reaction was noted.

Example 3 was repeated using the above catalyst solution (0.65 g) instead. The reaction was run at room temperature for 3 hrs. The catalyst was then neutralized by the bubbling of carbon dioxide. The cooled mixture showed a viscosity of 2,840 cps (spindle #4), and was stable during storage.

The mixture was formulated into a curable composition by adding 0.75% diethoxyacetophenone and 0.3% titanium isopropoxide. One portion of the mixture was subjected to IIV cure as described above. The UV cured material showed a hardness of 42 (Shore OO). Another portion of the material was only subjected to moisture cure for 3 days. The moisture cured only material showed a hardness of 55 (Shore OO). The initially UV cured material after further moisture cure for 3 days gave a hardness reading of 68 (Shore OO).

EXAMPLE 6

Example 3 was repeated, but instead of lithium n-butyldimethylsilanolate, 1 ml of a 1.6M n-butyl-lithium in hexane solution was used. The mixture after end-capping showed a viscosity of 2,640 cps (spindle #4).

A formulation prepared by mixing 98.5% of this end-capped fluid with 1.5% of the photoinitiator diethoxyacetophenone was subjected tour cure. No titanium moisture cure catalyst was used. The cured material gave a hardness of 41 (Shore OO).

EXAMPLE 7

This example is intended as a model to show that the use of methanol with organo-lithium results in unstable viscosity in a non-reactive polydimethylsiloxane fluid. It is believed that the attack on and cleavage of the siloxane bond which results in a viscosity drop in this non-reactive fluid is an appropriate model for the same attack which occurs and results in viscosity deterioration in reactive fluid compositions employing aprotic or polar solvents.

To 300 g of 10,000 cps (spindle #4) trimethylsilyl terminated polydimethylsiloxane fluid was added 1 ml of a 1.6N lithium n-butyldimethylsilanolate in hexane solution. The mixture was then divided into 2 equal fractions of 150 g each. To one of the two fractions was further added 1 ml of methanol. Both fractions were kept in closed containers in a 25° C. water bath and their viscosities were monitored over a period of 6 days. The results are shown below:

TABLE 1

| Added | Fraction A No Methanol | Fraction B Methanol |
| --- | --- | --- |
| Initial viscosity Viscosity | 10,000 cps | 10,000 cps |
| @ 1 hr. | 10,500 cps | 9,140 cps |
| @ 2 hrs. | 10,500 cps | 8,620 cps |
| @ 3 hrs. | 10,500 cps | 8,280 cps |

TABLE 1-continued

| Added | Fraction A No Methanol | Fraction B Methanol |
| --- | --- | --- |
| @ 4 hrs. | 10,500 cps | 8,040 cps |
| @ 5 hrs. | 10,400 cps | 7,900 cps |
| @ 6 hrs. | 10,400 cps | 7,720 cps |
| @ 24 hrs. | 10,600 cps | 5,400 cps |
| @ 48 hrs. | 10,400 cps | 4,280 cps |
| @ 144 hrs. | 10,200 cps | 2,400 cps |

It is clear from Table I that use of methanol has a clear detrimental effect on the viscosity over time as evidenced by the significant viscosity drop in Fraction B.

EXAMPLE 8

A silanol terminated polydimethylsiloxane fluid with a viscosity of 47,000 cps (spindle #6) was used for three comparative studies.

(1) Three kilograms of the silanol terminated fluid was mixed with 29 g of vinyltrimethoxysilane and 3.7 g of a lithium n-butyldimethylsilanolate in hexane solution containing 1.21% (15 ppm) lithium (by weight lithium atom) as lithium silanolate. The mixture was heated to 50° C. with mixing for 3 hours. A few pieces of dry ice were then added to the mixture to quench the catalyst. The mixture was then cooled to room temperature and equilibrated at 25° C. for 2 days. The viscosity of the material was determined to be 44,500 cps, substantially similar to the 47,000 cps (spindle #6) starting material.

(2) The above procedure was repeated, but instead of the lithium n-butyldimethylsilanolate in hexane solution, 26.7 g of a 1% lithium hydroxide monohydrate in methanol solution was used (15 ppm Li). The viscosity of the material was determined to be 33,900 cps, substantially lower than the starting material.

(3) This example was used as a control. Three kilograms of the silanol terminated fluid was mixed with 29 g of vinyltrimethoxysilane and 26.7 g of methanol. No lithium catalyst was used. Due to the dilution of the polydimethylsiloxane by vinyltrimethoxysilane and methanol, the viscosity of the mixture was determined to be 41,100 cps. This example indicates that the viscosity drop is not as severe as with the lithium hydroxide monohydrate/methanol combination.

EXAMPLE 9

A 3,500 cps silanol terminated polydimethylsiloxane fluid was used for two comparative studies. In the first study, lithium hydroxide monohydrate in methanol solution was used whereas in the other study lithium n-butyldimethylsilanolate in hexane solution was used. In both cases, two molar equivalents of silane per molar equivalent of silanol group were added to the silanol terminated fluid. Fifteen parts per million of lithium either as a 1% lithium hydroxide in methanol solution as a lithium n-butyldimethylsilanolate in hexane solution was then added to the respective mixtures. Both reactions were mixed under nitrogen at room temperature. The viscosities of the mixtures were monitored periodically. The results are shown below in Table II.

TABLE II

| Time (hrs.) | Comparative LiOH.H$_2$O in MeOH | Inventive Lithium Silanolate In Hexane |
| --- | --- | --- |
| 3 | 3360 cps | 3460 cps |
| 6 | 3260 cps | 3480 cps |
| 24 | 2840 cps | 3300 cps |
| 48 | 2120 cps | 3400 cps |

As is evident from Table II, the alkoxy terminated organosiloxane fluids prepared using lithium hydroxide in methanol as the catalytic reagent demonstrated a marked drop in viscosity over a 24 to 48 hour period. In contrast, the alkoxy terminated organosiloxanes prepared using lithium silanolate in hexane demonstrated no substantial change in viscosity.

EXAMPLE 10

This example is intended to demonstrate that alkoxy-polyorganosiloxanes prepared from organotitanate catalysts do not have as great a percentage of end-capping as those prepared using organo-lithium catalysts. As mentioned above, it is known that the degree of hardness of a cured rubber is directly related to its degree and density of crosslinking. Thus, an alkoxy-polyorganosilane composition which exhibits a higher degree of hardness when cured is said to have a higher crosslinking density and a higher percentage of crosslinking. Other properties, such as tensile strength, will of course also be enhanced by more complete crosslinking.

For purposes of this experiment, U.S. Pat. No. 4,528,081 to Lien et al. was used as the prior aft alkoxy-terminated polyorganosiloxane prepared from an organotitanate catalyst.

The following example was taken from U.S. Pat. No. 4,528,081 to Lien at column 5, Example 2. A lower molecular weight (12,000) of hydroxyl terminated siloxane was used than was described by Lien (28,000) for convenience purposes. This was not expected to change the results.

The inventive example below represents virtually identical reactant materials except that an organo-lithium catalyst was used in place of organotitanate.

U.S. Pat. No. 4,528,081 to Lien, et al.

Organopolysiloxane Preparation

Three hundred (300) grams (95.3% by weight of the reactants) of a silanol terminated polydimethylsiloxane fluid with a number average molecular weight of 12,000 was placed in a one liter round bottom flask. To the flask were further added 13.64 g (4.3% by weight of the reactants) of methacryloxypropyl-trimethoxysilane, and 1.20 g (0.4% by weight of the reactants) tetraisopropyl titanate. The mixture immediately thickened to a solid mixture upon the addition of titanate, indicating thick-phasing. The flask was placed on a rotary vaporizer at 80° C. with vacuum for 4 hours. The initially thick solid changed into a yellowish oil (polyorganosiloxane) during this treatment.

Composition and Testing

A formulation containing the thus formed end-capped polyorganosiloxane product was made by mixing 49.25 g of the polyorganosiloxane oil formed above (98.12% of the product and 0.38% tetraisopropyl titanate) with 0.75 g (1.5%) of a photoinitiator, diethoxyacetophenone. UV irradiation of this formulation using a Fusion System at 70,000 microwatts/cm$^2$ for 1 minute afforded a yellowish silicone rubber with a hardness reading of 58 using a durometer (00) gauge. The cured silicone rubber was further allowed to stand at ambient conditions to complete the moisture cure. The cured rubber gave a hardness reading of 62 after overnight and 68 after three days.

The above formulation was also moisture cured only. The silicone rubber gave a hardness reading of 48 after moisture cure overnight and 56 after three days.

INVENTIVE COMPOSITION

Organopolysiloxane Preparation

Three hundred (300) grams (95.6% by weight of the reactants) of the silanol terminated polydimethylsiloxane fluid was placed in a one liter three neck round bottom flask. To the flask were further added 13.64 g (4.4% by weight of the reactants) of methacryloxpropyltrimethoxysilane and 0.25 ml (negligible amount) of 1.6M butyl-lithium in hexane. The mixture was stirred at room temperature for 30 minutes with nitrogen sparge to obtain a clear fluid. Several pieces of dry ice were then added to the mixture to quench the lithium catalyst in accordance with the present invention.

Composition and Testing

A formulation was made by mixing 49.05 g (98.1%) of the thus-formed polyorganosiloxane with 0.20 g (0.4%) of the moisture catalyst, tetraisopropyl titanate, and 0.75 g (1.5%) of diethoxyacetophenone.

UV irradiation of this formulation using a Fusion System at 70,000 microwatts/cm$^2$ for 1 minute also afforded a yellowish silicone rubber but with a hardness reading of 71 using a durometer (00) gauge. The cured silicone rubber was further allowed to stand in the ambient to complete the moisture cure. The cured rubber gave a hardness reading of 75 after overnight and 78 after three days.

The above formulation was also moisture cured only. The silicone rubber gave a hardness reading of 59 after overnight and 67 after three days.

From the above experiment, it is apparent that organopolysiloxanes prepared using organo-lithium catalysts (butyl-lithium) cured to a harder degree than the titanate catalyzed material. The hardness of the cured material is a direct result of increased crosslinking density which in turn is directly proportional to the degree and efficiencies of the end-capping reactions.

The invention being thus described, it will be obvious that the same may be varied in many ways. Such variations are not to be regarded as a departure from the spirit and scope of the invention and all such modifications are intended to be included within the scope of the following claims:

We claim:

1. A reaction product prepared, in non-polar solution, from (i) an organopolysiloxane having at least both ends terminating with a silanol group; (ii) a silane containing at least three alkoxy groups; and (iii) a catalytically effective amount of an organo-lithium reagent;
    said reaction product comprising a reactive organopolysiloxane having terminal ends including at least two alkoxy groups attached to a silicon atom and which reaction product has a viscosity stability in the absence of quenching which is greater than reactive organopolysiloxanes prepared from components (i) and (ii) above in methanol.

2. The reaction produce of claim 1 wherein the organo-lithium reagent is represented by the formula:

$$LiR^{12}$$

wherein the organo group R$^{12}$ has up to 18 carbon atoms and is selected from the group consisting of alkyl, aryl, alkylaryl, arylalkyl, alkenyl and alkynyl groups, an amine-containing compound and a silicon-containing compound.

3. The reaction product of claim 2 wherein the alkyl-lithium reagent is selected from the group consisting of methyl lithium, n-butyl lithium, sec-butyl lithium, t-butyl lithium, n-hexyl lithium, 2-ethylhexyl lithium and n-octyl lithium.

4. The reaction product of claim 3 further comprising a material selected from the group consisting of fillers, pigments, adhesion promoters and moisture scavengers.

5. The reaction product of claim 2 wherein the aryl lithium reagent is phenyl lithium.

6. The reaction product of claim 2 wherein the lithium reagent is selected from the group consisting of vinyl lithium, lithium phenylacetylide and lithium (trimethylsilyl) acetylide.

7. The reaction product of claim 2 wherein the organo-lithium reagent is selected from the group consisting of lithium dimethylamide, lithium diethylamide, lithium diisopropylamide and lithium dicyclohexylamide.

8. The reaction product of claim 2 wherein R$^{12}$ is $$OSiR^9R^{10}R^{11} \text{ or } O(SiR^9R^{10}O)_tSiR^9R^{10}R^{11}$$

wherein R$^9$ and R$^{10}$ are monovalent hydrocarbon radicals C$_{1-10}$; R$^{11}$ is C$_{1-18}$ alkyl or aryl and t is a positive integer.

9. The reaction product of claim 1 wherein the reactive organopolysiloxane additionally contains a photo curable group.

10. The reaction product of claim 9 wherein the photo curable group is selected from the group consisting of acrylate, methacrylate and glycidoxyl groups.

11. The reaction product of claim 10 wherein the (meth) acrylate group is acryloxypropyl or methacryloxypropyl.

12. The reaction product of claim 9 wherein the alkoxy terminated organopolysiloxane is controllably curable by photo curing and moisture curing mechanisms.

13. The reaction product of claim 9 wherein the organopolysiloxane having both ends terminating with a silanol group is represented by the formula:

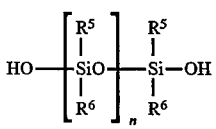

wherein R$^5$ and R$^6$ are methyl or phenyl groups; n is 10 to 1,200; and the silane containing at least three alkoxy groups is represented by the formula:

$$(R^7)Si(OR^8)_3$$

wherein R$^7$ is a (meth)acrylate group, and R$^8$ is a monovalent hydrocarbon radical C$_{1-10}$.

14. The reaction product of claim 9 wherein the reactive organopolysiloxane is the reaction product of methacryloxypropyltrimethoxysilane and a silanol terminated polydimethylsiloxane in the presence of a catalyst selected from the group consisting of n-butyl lithium, lithium t-butyl dimethylsilanolate and lithium n-butyl dimethylsilanolate.

15. The reaction product of claim 9 further comprising a photoinitiator selected from the group consisting of benzoins, benzophenone, dialkoxy-benzophenones, Michler's ketone and diethoxyacetophenone.

16. The reaction product of claim 9 further comprising a moisture curing catalyst.

17. The reaction product of claim 16 wherein the moisture curing catalyst is selected from the group consisting of organic titanium derivatives, organic tin derivatives and mixtures thereof.

18. The reaction product of claim 9 further comprising a material selected from the group consisting of fillers, pigments, adhesion promoters and moisture scavengers.

19. The reaction product of claim 1 further comprising a moisture curing catalyst to form a one-part curable composition.

20. The reaction product of claim 19 wherein the moisture curing catalyst is selected from the group consisting of organic titanium derivatives, organic tin derivatives and mixtures thereof.

21. The reaction product of claim 12 having a viscosity in a range of about 100 cps to about 60,000 cps.

22. The reaction product of claim 1 wherein the reactive organopolysiloxane having at least two alkoxy groups attached to the silicon atom on both ends has the formula:

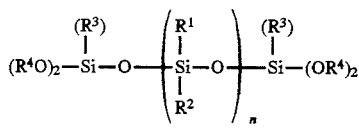

wherein $R^1$, $R^2$, $R^3$ and $R^4$ are identical or different and are monovalent hydrocarbon radicals having $C_{1-10}$, and wherein $R^3$ is $OR^4$ or optionally a $C_{1-10}$ heterohydrocarbon radical having hereto atoms selected from the group consisting of halo atoms, O, N and S; $R^4$ is alkyl $C_{1-10}$; n is a positive integer.

23. A composition curable by both moisture and photo cure mechanisms, said composition comprising:

(a) a reactive organopolysiloxane having terminal ends including at least two alkoxy groups attached to a silicon atom and at least one photo curing group on at least one terminal end, said reactive organopolysiloxane being prepared in non-polar solution in the presence of an organo-lithium reagent and having a greater viscosity stability in the absence of quenching as compared to reactive organopolysiloxanes prepared in methanol;

b) a curably effective amount of a photoinitiator; and c) a curably effective amount of a moisture curing catalyst.

24. The composition of claim 23 wherein the organolithium reagent is selected from the group consisting of alkyl, aryl, alkenyl and alkynyl lithium groups, each having up to 18 carbon atoms, lithium silanolate and siloxanolate having the formulas $LiOSiR^9R^{10}R^{11}$ and $Li(OSiR^9R^{10})_t$ $SiR^9R^{10}R^{11}$ respectively, wherein $R^9$ and $R^{10}$ are monovalent hydrocarbon radicals having up to 10 carbon atoms and $R^{11}$ is an alkyl or aryl group having up to 18 carbon atoms and t is a positive integer from 1 to 10, and lithium dialkyl $C_{1-6}$ amides.

25. The composition of claim 23 formed from an organopolysiloxane having both ends terminating with a silanol group and represented by the formula:

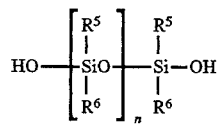

wherein $R^5$ and $R^6$ are methyl or phenyl groups; n is 10 to 1,200; and a silane containing at least two alkoxy groups and at least one photocurable group, represented by the formula:

wherein $R^7$ is a (meth)acrylate group, $R^8$ is a $C_{1-10}$ monovalent hydrocarbon radical.

26. A photocurable composition comprising:

(a) a reactive organopolysiloxane having terminal ends including at least two alkoxy groups attached to the silicon atom and at least one photo curing group on at least one terminal end, said reactive organopolysiloxane being prepared in non-polar solution in the presence of an organo-lithium reagent and having a greater viscosity stability in the absence of quenching as compared to the same reactive organopolysiloxanes prepared in methanol; and (b) a curably effective amount of a photoinitiator.

27. The composition of claim 26 wherein the organolithium reagent selected from the group consisting of alkyl, aryl, alkenyl and alkynyl lithium groups, each having up to 18 carbon atoms, lithium silanolate and siloxanolate having the formulas $LiOSiR^9R^{10}R^{11}$ and $Li(OSiR^9R^{10}O)_t$ $SiR^9R^{10}R^{11}$ respectively, wherein $R^9$ and $R^{10}$ are monovalent hydrocarbon radicals having up to 10 carbon atoms and $R^{11}$ is an alkyl or aryl group having up to 18 carbon atoms and t is a positive integer from 1 to 10, and dialkyl $C_{1-6}$ amides.

28. The composition of claim 26 formed from an organopolysiloxane having both ends terminating with a silanol group and represented by the formula:

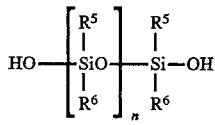

wherein $R^5$ and $R^6$ are methyl or phenyl groups; n is 10 to 1,200; and a silane containing at least three alkoxy groups and at least one photocurable group, represented by the formula:

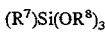

wherein $R^7$ is a (meth)acrylate group, $R^8$ is a $C_{1-10}$ monovalent hydrocarbon radical.

29. The composition of claim 28 wherein the (meth) acrylate group is acryloxypropyl or methacryloxypropyl.

* * * * *

UNITED STATES PATENT AND TRADEMARK OFFICE
CERTIFICATE OF CORRECTION

PATENT NO. : 5,663,269
DATED : September 2, 1997
INVENTOR(S) : Chu, et al.

It is certified that error appears in the above-indentified patent and that said Letters Patent is hereby corrected as shown below:

N THE SPECIFICATION:

Column 1, Line 27, now reads "carboxylic acid/mine combinations", should read -- carboxylic acid/amine combinations --;

Column 12, Line 20, now reads "to IIV cure as", should read -- to UV cure as --;

Column 12, Line 35, now reads "tour cure", should read -- to UV cure --;

Column 13, Line 63, after "solution", insert - or --;

Column 14, Line 34, now reads "prior aft", should read -- prior art --;

IN THE CLAIMS:

Column 16, Line 1, now read "reaction produce", should read -- reaction product --;

UNITED STATES PATENT AND TRADEMARK OFFICE
CERTIFICATE OF CORRECTION

PATENT NO. : 5,663,269
DATED : September 2, 1997
INVENTOR(S) : Chu, et al.

It is certified that error appears in the above-identified patent and that said Letters Patent is hereby corrected as shown below:

Column 17, Line 56,      now reads "and $Li(OSiR^9R^{10})_t$,", should read -- and $Li(OSiR^9R^{10}O)_t$ --;

Column 18, Line 31,      after "reagent", insert -- is --.

Signed and Sealed this

Tenth Day of March, 1998

BRUCE LEHMAN

*Attest:*

*Attesting Officer*      *Commissioner of Patents and Trademarks*